(12) United States Patent
Qu et al.

(10) Patent No.: US 10,312,372 B2
(45) Date of Patent: Jun. 4, 2019

(54) PRODUCTION METHOD OF FIELD-EFFECT TRANSISTOR, PRODUCTION METHOD OF ARRAY SUBSTRATE, FIELD-EFFECT TRANSISTOR, ARRAY SUBSTRATE, AND DISPLAY PANEL

(71) Applicants: BOE Technology Group Co., Ltd., Beijing (CN); Beijing BOE Display Technology Co., Ltd., Beijing (CN)

(72) Inventors: Lianjie Qu, Beijing (CN); Guangdong Shi, Beijing (CN); Shuai Liu, Beijing (CN); Minqi Chen, Beijing (CN); Tao Liu, Beijing (CN)

(73) Assignees: BOE TECHNOLOGY GROUP CO., LTD., Beijing (CN); BEIJING BOE DISPLAY TECHNOLOGY CO., LTD, Beijing (CN)

( * ) Notice: Subject to any disclaimer, the term of this patent is extended or adjusted under 35 U.S.C. 154(b) by 0 days.

(21) Appl. No.: 15/579,051

(22) PCT Filed: May 23, 2017

(86) PCT No.: PCT/CN2017/085482
§ 371 (c)(1),
(2) Date: Dec. 1, 2017

(87) PCT Pub. No.: WO2017/211176
PCT Pub. Date: Dec. 14, 2017

(65) Prior Publication Data
US 2018/0308970 A1    Oct. 25, 2018

(30) Foreign Application Priority Data
Jun. 6, 2016 (CN) .......................... 2016 1 0394974

(51) Int. Cl.
*H01L 29/786* (2006.01)
*H01L 27/12* (2006.01)
(Continued)

(52) U.S. Cl.
CPC .......... *H01L 29/786* (2013.01); *H01L 27/124* (2013.01); *H01L 27/1225* (2013.01); *H01L 29/42384* (2013.01); *H01L 29/66742* (2013.01)

(58) Field of Classification Search
None
See application file for complete search history.

(56) References Cited

U.S. PATENT DOCUMENTS

| 2011/0084262 A1* | 4/2011 | Kondratyuk | ...... H01L 29/78645 257/43 |
| 2016/0225907 A1* | 8/2016 | Kim | .................... H01L 29/7869 |
| 2017/0186784 A1* | 6/2017 | Yang | .................... H01L 29/7869 |

FOREIGN PATENT DOCUMENTS

| CN | 102683208 A | 9/2012 |
| CN | 104465652 A | 3/2015 |

(Continued)

OTHER PUBLICATIONS

English Translation of International Search Report and Box V of the Written Opinion from International Patent Application No. PCT/CN2017/085482, dated Sep. 6, 2017, 4 pages.

*Primary Examiner* — Daniel Whalen
(74) *Attorney, Agent, or Firm* — Westman, Champlin & Koehler, P.A.

(57) ABSTRACT

This disclosure relates to a field-effect transistor and a production method thereof, an array substrate and a production method thereof, and a display panel. The production method comprises: forming an active layer on a substrate; forming a gate electrode insulating layer on the active layer to define a gate electrode area as well as a source electrode (Continued)

area and a drain electrode area located on two sides of the gate electrode area on the active layer; applying a gate electrode layer to cover surfaces of the active layer and the gate electrode insulating layer; patterning the gate electrode layer to form a first contact electrode, a second contact electrode, and a gate electrode, wherein the first contact electrode is located on the source electrode area, the second contact electrode is located on the drain electrode area, and the gate electrode is located on the gate electrode insulating layer.

9 Claims, 2 Drawing Sheets

(51) Int. Cl.
*H01L 29/423* (2006.01)
*H01L 29/66* (2006.01)

(56) References Cited

FOREIGN PATENT DOCUMENTS

| CN | 205177844 U | 4/2016 |
| CN | 105927812 A | 9/2016 |

\* cited by examiner

PRODUCTION METHOD OF FIELD-EFFECT TRANSISTOR, PRODUCTION METHOD OF ARRAY SUBSTRATE, FIELD-EFFECT TRANSISTOR, ARRAY SUBSTRATE, AND DISPLAY PANEL

CROSS-REFERENCE TO RELATED APPLICATION

This application is a Section 371 National Stage Application of International Application No. PCT/CN2017/085482, filed May 5, 2017, which is not yet published, and claims the priority of Chinese Patent Application No. 201610394974.1 filed on Jun. 6, 2016, the contents of which are incorporated as a part of this application by reference in their entirety.

FIELD OF THE INVENTION

This disclosure relates to the technical field of display, and particularly to a field-effect transistor and a production method thereof, an array substrate and a production method thereof, and a display panel.

BACKGROUND OF THE INVENTION

In the MOSFET structure in an early stage, certain overlapped covered parts are often provided between the gate electrode and the source electrode area and between the gate electrode and the drain electrode area, in view of alignment errors of the process. However, if the overlapped parts are excessively, large parasitic capacitances between the gate and the source and between the gate and the drain are excessively increased, thereby leading to the deterioration of high-frequency characteristics of the device (particularly, the parasitic capacitance between the gate and the drain is a Miller capacitance, and has more influence). Therefore, in order to allow the conduction of the device while the high-frequency characteristics of the device are deteriorated, the overlapped parts between the gate and the source or between the gate and the drain are required to be as small as possible and highly precise alignment is thus achieved. The self-alignment process is a newly developing process. However, with respect to a self-aligned oxide semiconductor thin film transistor in a conventional process, it is difficult to ensure the distances from the gate electrode to the source electrode and the drain electrode, and the distances from the source electrode and the drain electrode on the left and right sides to the gate electrode will be inconsistent. Therefore, it is difficult to control the characteristics of the TFT, whereas the management and control requirements for the distances from the gate electrode to the source electrode and the drain electrode are very high, with respect to the self-aligned oxide semiconductor thin film transistor.

SUMMARY OF THE INVENTION

The embodiments of this disclosure provide a field-effect transistor and a production method thereof, an array substrate and a production method thereof, and a display panel.

An object of this disclosure is to provide a production method of a field-effect transistor.

A first aspect of this disclosure provides a production method of a field-effect transistor, comprising the steps of:

forming an active layer on a substrate; and forming a gate electrode insulating layer on the active layer to define a gate electrode area as well as a source electrode area and a drain electrode area located on two sides of the gate electrode area on the active layer;

applying a gate electrode layer to cover surfaces of the active layer and the gate electrode insulating layer; and patterning the gate electrode layer to form a first contact electrode, a second contact electrode, and a gate electrode, wherein the first contact electrode is located on the source electrode area, the second contact electrode is located on the drain electrode area, and the gate electrode is located on the gate electrode insulating layer.

In one embodiment, the production method further comprises a step of providing an intermediate layer on the patterned gate electrode layer, wherein the intermediate layer also covers exposed surfaces of the substrate and the active layer.

In one embodiment, providing the intermediate layer further comprises a step of patterning the intermediate layer to form a first through hole and a second through hole in the intermediate layer, and wherein the first through hole is aligned with the first contact electrode; and the second through hole is aligned with the second contact electrode.

In one embodiment, "the first through hole is aligned with the first contact electrode" means that: the bottom of the first through hole reaches the upper surface of the first contact electrode; and with respect to projections on the substrate, the distance between the projection of the first through hole and the projection of the gate electrode is greater than or equal to the distance between the projection of the first contact electrode and the projection of the gate electrode; and "the second through hole is aligned with the second contact electrode" means that: the bottom of the second through hole reaches the upper surface of the second contact electrode; and with respect to projections on the substrate, the distance between the projection of the second through hole and the projection of the gate electrode is greater than or equal to the distance between the projection of the second contact electrode and the projection of the gate electrode.

In one embodiment, the production method further comprises a step of:

providing a source electrode and a drain electrode respectively on the intermediate layer, wherein the source electrode is connected to the first contact electrode through the first through hole, and the drain electrode is connected to the second contact electrode through the second through hole.

Another object of this disclosure is to provide a production method of an array substrate.

A second aspect of this disclosure provides a production method of an array substrate, comprising the steps of:

preparing a field-effect transistor by the production method of a field-effect transistor as described above;

forming an insulating layer on the field-effect transistor; and forming a pixel electrode on the insulating layer, wherein the pixel electrode is configured to be connected to either of the source electrode and the drain electrode.

Still another object of this disclosure is to provide a field-effect transistor.

A third aspect of this disclosure provides a field-effect transistor, comprising:

a substrate;

an active layer provided on the substrate;

a gate electrode insulating layer provided on the active layer, the gate electrode insulating layer defining a gate electrode area as well as a source electrode area and a drain electrode area located on two sides of the gate electrode area on the active layer;

a first contact electrode located on the source electrode area;

a second contact electrode located on the drain electrode area; and a gate electrode located on the gate electrode insulating layer.

In one embodiment, the first contact electrode and the second contact electrode are formed concurrently with the gate electrode by using the same material.

In one embodiment, the field-effect transistor further comprises an intermediate layer, wherein the intermediate layer is provided on the first contact electrode, the gate electrode, and the second contact electrode, wherein the intermediate layer also covers exposed surfaces of the substrate and the active layer.

In one embodiment, the field-effect transistor further comprises a first through hole and a second through hole provided in the intermediate layer, wherein the first through hole is aligned with the first contact electrode; and the second through hole is aligned with the second contact electrode.

In one embodiment, "the first through hole is aligned with the first contact electrode" means that: the bottom of the first through hole reaches the upper surface of the first contact electrode; and with respect to projections on the substrate, the distance between the projection of the first through hole and the projection of the gate electrode is greater than or equal to the distance between the projection of the first contact electrode and the projection of the gate electrode; and "the second through hole is aligned with the second contact electrode" means that: the bottom of the second through hole reaches the upper surface of the second contact electrode; and with respect to projections on the substrate, the distance between the projection of the second through hole and the projection of the gate electrode is greater than or equal to the distance between the projection of the second contact electrode and the projection of the gate electrode.

In one embodiment, the field-effect transistor further comprises a source electrode and a drain electrode located on the intermediate layer, wherein the source electrode is connected to the first contact electrode through the first through hole, and the drain electrode is connected to the second contact electrode through the second through hole.

Another object of this disclosure is to provide an array substrate.

A fourth aspect of this disclosure provides an array substrate comprising the field-effect transistor as described above, an insulating layer, and a pixel electrode, wherein the insulating layer is located on the field-effect transistor, and wherein the pixel electrode is located on the insulating layer, and the pixel electrode is connected to either of the source electrode and the drain electrode.

Yet another object of this disclosure is to provide a display panel comprising the array substrate as described above.

A fifth aspect of this disclosure provides a display panel, comprising the array substrate as described above.

With respect to the field-effect transistor and the production method thereof, the array substrate and the production method thereof, and the display panel provided in embodiments of this disclosure, an active layer is formed on a substrate; a gate electrode insulating layer is formed on the active layer to define a gate electrode area as well as a source electrode area and a drain electrode area located on two sides of the gate electrode area on the active layer; a gate electrode layer is applied to cover surfaces of the active layer and the gate electrode insulating layer; and the gate electrode layer is patterned to form a first contact electrode, a second contact electrode, and a gate electrode, wherein the first contact electrode is located on the source electrode area, the second contact electrode is located on the drain electrode area, and the gate electrode is located on the gate electrode insulating layer.

BRIEF DESCRIPTION OF THE DRAWINGS

In order to illustrate the technical solutions in the embodiments of this disclosure more clearly, the accompanying drawings of embodiments will be simply illustrated below. It is to be understood that the accompanying drawings described below are merely some embodiments related to this disclosure but not limitations of this disclosure, in which.

DETAILED DESCRIPTION OF THE INVENTION

In order to enable the objects, technical solutions, and advantages of embodiments of this disclosure to be clearer, the technical solutions of the embodiments of this disclosure will be described clearly and fully below in conjunction with the accompanying drawings. Obviously, the embodiments described are a part of the embodiments of this disclosure, rather than all of the embodiments. Based on the embodiments described of this disclosure, all other embodiments obtained by the person skilled in the art without performing inventive work also belong to the scope protected by this disclosure.

When introducing the elements of this disclosure and the embodiments thereof, singular forms of the words used herein and the appended claims comprise plural forms, unless the context clearly dictates otherwise, vice versa. Therefore, when reference is made to a singular form of a term, a corresponding plural form of this term is typically encompassed. The terms "comprise", "include", "contain", and "have" are intended to be inclusive and indicate that there may be additional elements other than the elements listed.

For the purpose of the description of the surface hereinafter, the terms "upper", "lower", "right", "left", "vertical", "horizontal", "top", "bottom", and derivatives thereof shall relate to the disclosure as it is oriented in the accompanying drawings. The terms "on", "on the top of", "located on", and "located on the top of" mean that there is a first element such as a first structure present on a second element such as a second structure, wherein there may be an intermediate element such as an interface structure between the first element and the second element. The term "contact" means that a first element such as a first structure and a second element such as a second structure are connected and there may be or may not be other elements at the interface of the two elements.

FIGS. 1-6 are schematic diagrams of the production methods of field-effect transistors according to embodiments of this disclosure.

Figure 1:
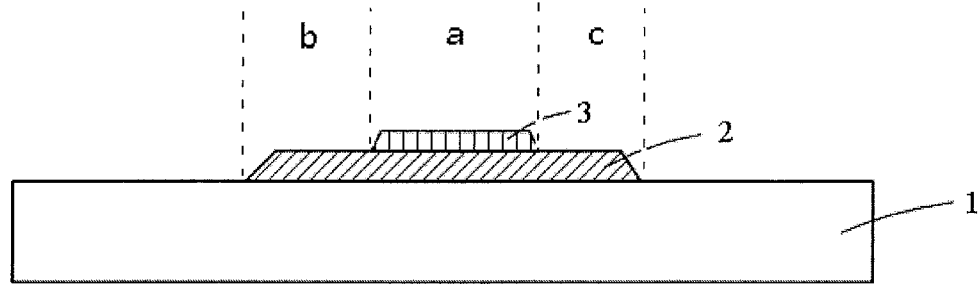
FIG. 1 is a schematic diagram of a production method of a field-effect transistor according to an embodiment of this disclosure.
Figure 2:
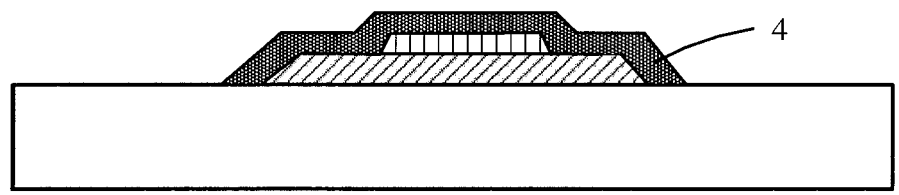
FIG. 2 is a schematic diagram of a production method of a field-effect transistor according to an embodiment of this disclosure.

As shown in FIG. 1, an active layer 2 is formed on a substrate 1, and a gate electrode insulating layer 3 is formed on the active layer 2 to define a gate electrode area a as well as a source electrode area b and a drain electrode area c located on two sides of the gate electrode area on the active layer 2, Further, as shown in FIG. 2, a gate electrode layer 4 is applied to cover the surfaces of the active layer 2 and the gate electrode insulating layer 3.

Figure 3:
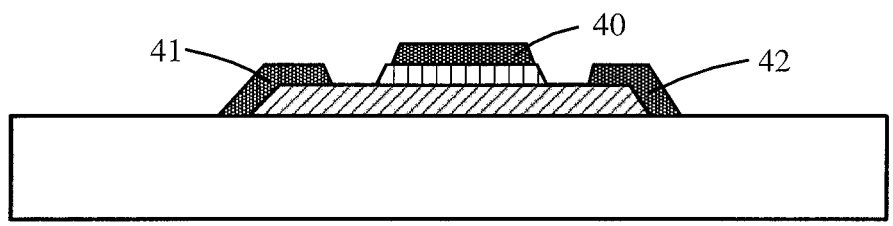
FIG. 3 is a schematic diagram of a production method of a field-effect transistor according to an embodiment of this disclosure.

Next, as shown in FIG. 3, the gate electrode layer 4 is patterned (for example, by photolithographic etching) to form a first contact electrode 41, a gate electrode 40, and a second contact electrode 42, wherein the first contact electrode 41 is located on the source electrode area, the second contact electrode 42 is located on the drain electrode area, and the gate electrode 40 is located on the gate electrode insulating layer 3.

Figure 4:
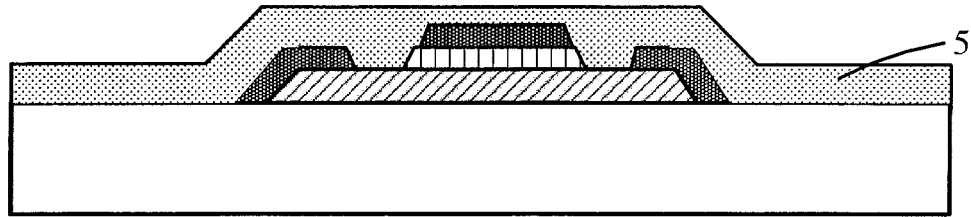
FIG. 4 is a schematic diagram of a production method of a field-effect transistor according to an embodiment of this disclosure.

As shown in FIG. 4, an intermediate layer 5 is further provided on the patterned gate electrode layer, wherein the intermediate layer 5 also covers exposed surfaces of the substrate and the active layer.

Figure 5:
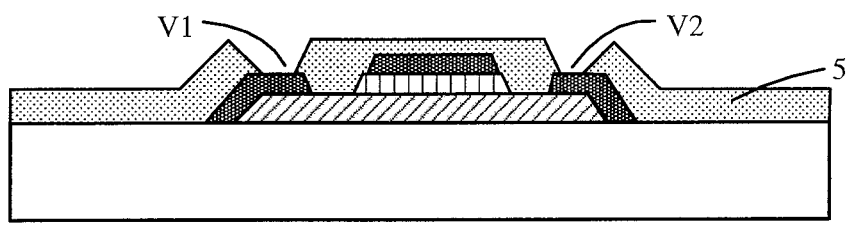
FIG. 5 is a schematic diagram of a production method of a field-effect transistor according to an embodiment of this disclosure.

As shown in FIG. 5, the intermediate layer 5 is patterned (for example, by photolithographic etching), so that a first through hole V1 and a second through hole V2 are formed in the intermediate layer 5. Here, the first through hole V1 is aligned with the first contact electrode 41; and the second through hole V2 is aligned with the second contact electrode 42. Here, the phrase "the first through hole V1 is aligned with the first contact electrode 41" means that: the bottom of the first through hole V1 reaches the upper surface of the first contact electrode 41; and with respect to projections on the substrate, the distance between the projection of the first through hole V1 and the projection of the gate electrode 40 is greater than or equal to the distance between the projection of the first contact electrode 41 and the projection of the gate electrode 40. Here, the phrase "the second through hole V2 is aligned with the second contact electrode 42" means that: the bottom of the second through hole V2 reaches the upper surface of the second contact electrode 42; and with respect to projections on the substrate, the distance between the projection of the second through hole V2 and the projection of the gate electrode 40 is greater than or equal to the distance between the projection of the second contact electrode 42 and the projection of the gate electrode 40.

Figure 6:
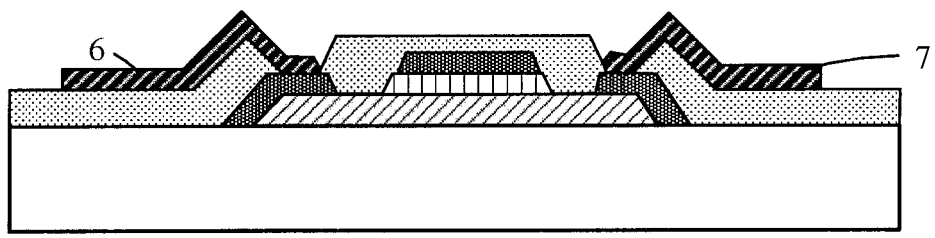
FIG. 6 is a schematic diagram of a production method of a field-effect transistor according to an embodiment of this disclosure.

As shown in FIG. 6, a source electrode 6 and a drain electrode 7 are respectively provided on the intermediate layer 5. Here, the source electrode 6 is connected to the first contact electrode 41 through the first through hole V1; and the drain electrode 7 is connected to the second contact electrode 42 through the second through hole V2. It is to be indicated that the positions of the source electrode and the drain electrode are merely schematic and the positions thereof may be interchangeable.

According to the production methods of transistors as shown in FIGS. 1-6, the consistency and the stability of the distances from the gate electrode to the source electrode and from the gate electrode to the drain electrode are thereby ensured by gate electrode alignment, and the fluctuation of TFT characteristics caused by the distance difference between both are avoided. It is to be indicated that the consistency of the distances from the source electrode to the gate electrode and from the gate electrode to the drain electrode in the figures is also schematic. Each of the source electrode and the drain electrode may be separated from the gate electrode at a desirable distance, as needed.

The transistor in an embodiment of this disclosure comprises: a first contact electrode 41 located on the source electrode area; a second contact electrode 42 located on the drain electrode area; and a gate electrode 40 located on the gate electrode insulating layer, wherein the first contact electrode and the second contact electrode are separated from the gate electrode at a desirable distance.

In one embodiment, the first contact electrode and the second contact electrode are formed concurrently with the gate electrode by using the same material. The field-effect transistor may further comprise an intermediate layer, wherein the intermediate layer is provided on the first contact electrode, the gate electrode, and the second contact electrode.

The field-effect transistor according to an embodiment of this disclosure may further comprise a first through hole and a second through hole provided in the intermediate layer, wherein the first through hole is aligned with the first contact electrode; and the second through hole is aligned with the second contact electrode.

The field-effect transistor according to an embodiment of this disclosure may further comprise a source electrode and a drain electrode located on the intermediate layer, wherein the source electrode is connected to the first contact electrode through the first through hole, and the drain electrode is connected to the second contact electrode through the second through hole.

It is to be indicated that unlike the prior art, the material of the gate electrode in this disclosure is not limited to polycrystalline silicon materials having a good heat resistance, and it may include any suitable materials. As the substrate, the intermediate layer, and the gate electrode insulating layer, any suitable materials such as silicon nitride, silicon dioxide, organic resins, and the like may be used. As the gate electrode, the source electrode, and the drain electrode, any suitable materials, for example metal materials, such as, molybdenum, aluminum, and the like, or alloys thereof can be used.

The array substrate according to an embodiment of this disclosure comprises the field-effect transistor described above, an insulating layer, and a pixel electrode, wherein the insulating layer is located on the field-effect transistor, and wherein the pixel electrode is located on the insulating layer, and the pixel electrode is connected to either of the source electrode and the drain electrode.

Figure 7:
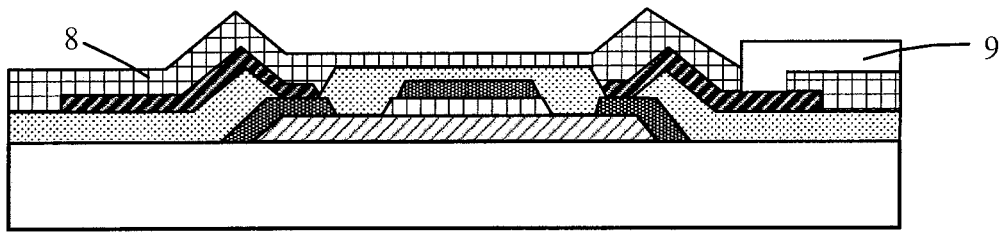
FIG. 7 is a schematic diagram of an array substrate according to an embodiment of this disclosure.

FIG. 7 is a schematic diagram of an array substrate according to one embodiment of this disclosure. As shown in FIG. 7, the array substrate comprises the field-effect transistor shown in FIG. 6, an insulating layer 8, and a pixel electrode 9, wherein the insulating layer 8 is located on the field-effect transistor, and wherein the pixel electrode 9 is located on the insulating layer, and the pixel electrode 9 is connected to the drain electrode 7 through a through hole. It is to be indicated that the connection of the pixel electrode and the drain electrode is merely exemplary, and the pixel electrode may be connected to the source electrode. The pixel electrode may comprise ITO, or may comprise other suitable materials. This is not limited in this disclosure.

The production method of an array substrate according to an embodiment of this disclosure comprises the steps of:

forming a field-effect transistor by the production method of a field-effect transistor as described above;

forming an insulating layer on the field-effect transistor; and forming a pixel electrode on the insulating layer, wherein the pixel electrode is configured to be connected to either of the source electrode and the drain electrode.

Particularly, specific description may be made with reference to FIG. 7. In one embodiment, an insulating layer 8 may be formed on the field-effect transistor produced in FIG. 6. Next, a third through hole is provided in the insulating layer 8. Then, a pixel electrode 9 is formed on the insulating layer 8, and the pixel electrode 9 is connected to a drain electrode 7 through the third through hole.

This disclosure provides technical solutions which can solve the problem that it is difficult to ensure the distances from the gate electrode to the source electrode and the drain electrode, and can achieve better control of the distances from the gate electrode to the source electrode and the drain electrode.

The use of display panels in embodiments of this disclosure include, but are not limited to the following articles: the products or members having the function of display, such as cell phones, tablet computers, televisions, laptops, digital photo frames, navigators, and the like.

Certain specific embodiments have been already described, and these embodiments are merely shown by way of examples but are not intended to limit the scope of this disclosure. In fact, the novel embodiments described herein may be implemented in various other forms. Furthermore, various omissions, replacements, and modifications may be made to the forms of embodiments described herein, without departing from the spirit of this disclosure. The appended claims and the equivalents thereof are intended to encompass such forms or modifications which fall in the scope and the spirit of this disclosure.

What is claimed is:

1. A production method of a field-effect transistor, comprising the steps of:

forming an active layer on a substrate;

forming a gate electrode insulating layer on the active layer to define a gate electrode area as well as a source electrode area and a drain electrode area located on two sides of the gate electrode area on the active layer;

applying a gate electrode layer to cover surfaces of the active layer and the gate electrode insulating layer; and patterning the gate electrode layer to form a first contact electrode, a second contact electrode, and a gate electrode, wherein the first contact electrode is located on the source electrode area, the second contact electrode is located on the drain electrode area, and the gate electrode is located on the gate electrode insulating layer, and providing an intermediate layer on the patterned gate electrode layer, wherein the intermediate layer also covers exposed surfaces of the substrate and the active layer, wherein providing the intermediate layer further comprises a step of patterning the intermediate layer to form a first through hole and a second through hole in the intermediate layer, wherein the first through hole is aligned with the first contact electrode, and the second through hole is aligned with the second contact electrode.

2. The production method according to claim 1, wherein "the first through hole is aligned with the first contact electrode" means that: the bottom of the first through hole reaches the upper surface of the first contact electrode; and with respect to projections on the substrate, the distance between the projection of the first through hole and the projection of the gate electrode is greater than or equal to the distance between the projection of the first contact electrode and the projection of the gate electrode; and "the second through hole is aligned with the second contact electrode" means that: the bottom of the second through hole reaches the upper surface of the second contact electrode; and with respect to projections on the substrate, the distance between the projection of the second through hole and the projection of the gate electrode is greater than or equal to the distance between the projection of the second contact electrode and the projection of the gate electrode.

3. The production method according to claim 1, further comprising a step of:

providing a source electrode and a drain electrode respectively on the intermediate layer, wherein the source electrode is connected to the first contact electrode through the first through hole, and the drain electrode is connected to the second contact electrode through the second through hole.

4. A production method of an array substrate, comprising the steps of:

preparing the field-effect transistor by the production method of the field-effect transistor as claimed in claim 3;

forming an insulating layer on the field-effect transistor; and forming a pixel electrode on the insulating layer, wherein the pixel electrode is configured to be connected to either of the source electrode and the drain electrode.

5. A field-effect transistor, comprising:

a substrate;

an active layer provided on the substrate;

a gate electrode insulating layer provided on the active layer, the gate electrode insulating layer defining a gate electrode area as well as a source electrode area and a drain electrode area located on two sides of the gate electrode area on the active layer;

a first contact electrode located on the source electrode area;

a second contact electrode located on the drain electrode area;

a gate electrode located on the gate electrode insulating layer;

an intermediate layer provided on the first contact electrode, the gate electrode, and the second contact electrode, wherein the intermediate layer also covers exposed surfaces of the substrate and the active layer;

a first through hole and a second through hole provided in the intermediate layer, wherein the first through hole is aligned with the first contact electrode, and the second through hole is aligned with the second contact electrode;

a source electrode and a drain electrode located on the intermediate layer, wherein the source electrode is connected to the first contact electrode through the first through hole, and the drain electrode is connected to the second contact electrode through the second through hole.

6. The field-effect transistor according to claim 5, wherein the first contact electrode and the second contact electrode are formed concurrently with the gate electrode by using the same material.

7. The field-effect transistor according to claim 5, wherein "the first through hole is aligned with the first contact electrode" means that: the bottom of the first through hole reaches the upper surface of the first contact electrode; and with respect to projections on the substrate, the distance between the projection of the first through hole and the projection of the gate electrode is greater than or equal to the distance between the projection of the first contact electrode and the projection of the gate electrode; and "the second through hole is aligned with the second contact electrode" means that: the bottom of the second through hole reaches the upper surface of the second contact electrode; and with respect to projections on the substrate, the distance between the projection of the second through hole and the projection of the gate electrode is greater than or equal to the distance between the projection of the second contact electrode and the projection of the gate electrode.

8. An array substrate comprising the field-effect transistor according to claim 5, an insulating layer, and a pixel electrode, wherein the insulating layer is located on the field-effect transistor, and wherein the pixel electrode is located on the insulating layer, and the pixel electrode is connected to either of the source electrode and the drain electrode.

9. A display panel comprising the array substrate according to claim 8.

* * * * *